United States Patent
Im et al.

(10) Patent No.: US 9,018,027 B2
(45) Date of Patent: Apr. 28, 2015

(54) METHOD OF FABRICATING GALLIUM NITRIDE-BASED SEMICONDUCTOR DEVICE

(71) Applicant: Seoul Viosys Co., Ltd., Ansan-si (KR)

(72) Inventors: Tae Hyuk Im, Ansan-si (KR); Chang Yeon Kim, Ansan-si (KR); Young Wug Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 13/950,958

(22) Filed: Jul. 25, 2013

(65) Prior Publication Data
US 2014/0030837 A1 Jan. 30, 2014

(30) Foreign Application Priority Data
Jul. 25, 2012 (KR) .................. 10-2012-0081111

(51) Int. Cl.
*H01L 21/02* (2006.01)
*H01L 33/00* (2010.01)
*H01L 33/32* (2010.01)

(52) U.S. Cl.
CPC ............ *H01L 21/0254* (2013.01); *H01L 33/32* (2013.01); *H01L 33/0079* (2013.01)

(58) Field of Classification Search
CPC . H01L 33/32; H01L 21/0254; H01L 33/0075; H01L 33/0079
USPC ...................................... 438/46, 478
See application file for complete search history.

(56) References Cited

U.S. PATENT DOCUMENTS

| | | | | |
|---|---|---|---|---|
| 2007/0261633 A1* | 11/2007 | Tanaka | ........................... | 117/952 |
| 2008/0108229 A1* | 5/2008 | Tanaka et al. | .................. | 438/795 |
| 2011/0215352 A1* | 9/2011 | Jeong et al. | ...................... | 257/94 |
| 2011/0312193 A1* | 12/2011 | Abe | ............................. | 438/795 |
| 2012/0309172 A1* | 12/2012 | Romano et al. | ............... | 438/478 |

* cited by examiner

*Primary Examiner* — Seahvosh Nikmanesh
(74) *Attorney, Agent, or Firm* — H.C. Park & Associates, PLC

(57) ABSTRACT

A method of fabricating a gallium nitride (GaN)-based semiconductor device. The method includes preparing a GaN substrate having lower and upper surfaces; growing GaN-based semiconductor layers on the upper surface of the GaN substrate to form a semiconductor stack; forming a support substrate on the semiconductor stack; and separating the GaN substrate from the semiconductor stack. The separating of the GaN substrate includes irradiating a laser from the lower surface of the GaN substrate. The laser is transmitted through the lower surface of the GaN substrate and forms a laser absorption region inside a structure consisting of the GaN substrate and the semiconductor stack.

20 Claims, 4 Drawing Sheets

METHOD OF FABRICATING GALLIUM NITRIDE-BASED SEMICONDUCTOR DEVICE

CROSS-REFERENCE TO RELATED APPLICATION

This application claims priority from and the benefit of Korean Patent Application No. 10-2012-0081111, filed on Jul. 25, 2012, which is hereby incorporated by reference for all purposes as if fully set forth herein.

BACKGROUND

1. Field

Exemplary embodiments of the present invention relate to a method of fabricating a gallium nitride (GaN)-based semiconductor device, and more particularly, to a method of fabricating a GaN-based light emitting diode (LED) with a vertical structure by using a GaN substrate as a growth substrate.

2. Discussion of the Background

In general, because nitrides of Group-III elements, such as gallium nitride (GaN) and aluminum nitride (AlN), have excellent thermal stability and a direct-transition-type energy band structure, the nitrides of Group-III elements have recently come into the spotlight as materials for light emitting devices in visible and ultraviolet regions. Particularly, blue and green light emitting devices using indium gallium nitride (InGaN) have been employed in various applications, such as large-sized full-color flat panel displays, traffic lights, indoor illumination, high-density light sources, high-resolution output systems, optical communications, and the like.

Because it is difficult to fabricate a homogeneous substrate on which a semiconductor layer of a nitride of Group-III elements can be grown, the semiconductor layer of a nitride of the Group III elements has been grown on a heterogeneous substrate having a similar crystal structure through a process such as metal organic chemical vapor deposition (MOCVD) or molecular beam epitaxy (MBE). A sapphire substrate having a hexagonal crystal system structure is frequently used as the heterogeneous substrate. Recently, there has been developed a technique for fabricating a high-efficiency light emitting diode (LED) with a vertical structure by growing epitaxial layers, such as nitride semiconductor layers, on a heterogeneous substrate, such as a sapphire substrate, bonding a support substrate to the epitaxial layers, and then separating the heterogeneous substrate using a laser lift-off technique or the like. Because the heterogeneous substrate and the epitaxial layer grown thereon, have different physical properties, the growth substrate can be easily separated at an interface therebetween. The separated heterogeneous substrate may be reused as a growth substrate or for other uses through surface treatment.

However, the epitaxial layer grown on the heterogeneous substrate has a relatively high dislocation density as a result of lattice mismatch and a difference in thermal expansion coefficients of the epitaxial layer and the growth substrate. It is known that the epitaxial layer grown on the sapphire substrate generally has a dislocation density of $1\times10^8/cm^2$. There is a limitation on improvement of the light emitting efficiency of the LED using such an epitaxial layer having the high dislocation density.

In order to reduce a crystal defect resulting from growth of the epitaxial layer on the heterogeneous substrate, there has been a recent attempt to use a GaN substrate as a growth substrate. The GaN substrate is a homogeneous substrate in connection with a GaN-based semiconductor layer grown thereon, and thus a high-quality GaN-based semiconductor layer can be grown by substantially reducing the number of crystal defects.

However, because the GaN substrate is a homogeneous substrate in connection with the GaN-based semiconductor layer grown thereon, it is difficult to separate the growth substrate from the GaN-based semiconductor layer at an interface between the substrate and the epitaxial layer. Particularly, because a laser used to separate a conventional sapphire substrate is entirely absorbed into the GaN substrate, the laser cannot be applied to the separate the GaN substrate.

Accordingly, studies regarding a technique for separating a GaN substrate using a laser have not yet been conducted, and it is presently acceptable to remove the GaN substrate by means of polishing. In this case, the GaN substrate cannot, however, be reused, resulting in increased total production costs.

SUMMARY OF THE INVENTION

Exemplary embodiments of the present invention provide a method of fabricating a gallium nitride (GaN)-based semiconductor device, in which a GaN substrate can be removed from an epitaxial layer.

Exemplary embodiments of the present invention also provide a method of fabricating a light emitting diode (LED) with a vertical structure by using a GaN substrate as a growth substrate.

Exemplary embodiments of the present invention also provide a high-efficiency LED with a vertical structure having improved light extraction efficiency.

Additional features of the invention will be set forth in the description which follows, and in part will be apparent from the description, or may be learned by practice of the invention.

An exemplary embodiment of the present invention discloses a method of fabricating a GaN-based semiconductor which includes preparing a GaN substrate having lower and upper surfaces; growing GaN-based semiconductor layers on the upper surface of the GaN substrate to form a semiconductor stack; forming a support substrate on the semiconductor stack; and separating the GaN substrate from the semiconductor stack. The separating of the GaN substrate includes irradiating a laser from the lower surface of the GaN substrate. The laser is transmitted through the lower surface of the GaN substrate and forms a laser absorption region inside a structure consisting of the GaN substrate and the semiconductor stack.

Another exemplary embodiment of the present invention also discloses the additional step of forming a sacrificial layer between the GaN substrate and the semiconductor stack such that the sacrificial layer has a bandgap narrower than a bandgap of the GaN substrate and the laser absorption region is disposed in the sacrificial layer.

The "laser absorption region" is a region into which the irradiated laser has been absorbed, and a compound semiconductor may be decomposed or at least damaged by the absorption of the laser.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
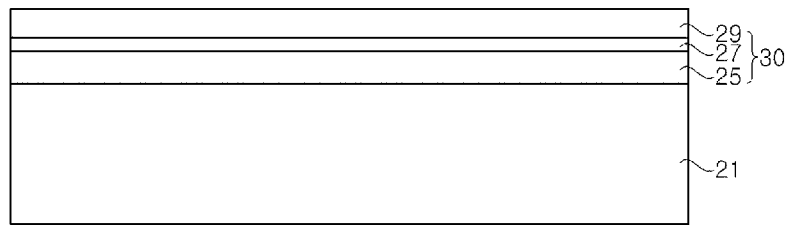
FIG. 1, FIG. 2, FIG. 3, FIG. 4, and FIG. 5 are sectional views illustrating a method of fabricating a gallium nitride (GaN) based semiconductor device according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers, regions, and other elements, including widths, lengths, thicknesses and the like, may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIGS. 1 to 5 are sectional views illustrating a method of fabricating a gallium nitride (GaN) based semiconductor device according to an exemplary embodiment of the present invention. Although a method of fabricating a light emitting diode with a vertical structure will be described in this embodiment, the present invention is not necessarily limited thereto.

Referring to FIG. 1, a GaN substrate 21 having lower and upper surfaces is prepared. The GaN substrate 21 may be fabricated from a bulk single crystal grown using either a hybrid vapor phase epitaxy (HYPE) technique or an ammono-thermal technique. Particularly, in order to use the GaN substrate 21 as a growth substrate, the upper surface of the GaN substrate 21 may be prepared by undergoing a surface treatment such as surface polishing.

GaN-based semiconductor layers are grown on the GaN substrate 21 to form a semiconductor stack 30. The semiconductor stack 30 may include, for example, a first conductivity-type semiconductor layer 25, an active layer 27 and a second conductivity-type semiconductor layer 29. The active layer 27 is positioned between the first and second conductivity-type semiconductor layers 25 and 29. Here, the first and second conductivity-types may be n-type and p-type, respectively, or vice versa, although the present invention is not limited thereto.

In this exemplary embodiment, a lowermost layer (e.g., the first conductivity-type semiconductor layer 25) of the semiconductor stack 30, which is in contact with the GaN substrate 21, may be a GaN layer. In another exemplary embodiment, the lowermost layer may include a material layer having a bandgap different from that of the GaN layer, e.g., an indium nitride (InN) layer or an indium gallium nitride (InGaN) layer.

Each of the first and second conductivity-type semiconductor layers 25 and 29 may be formed of a single layer or multiple layers. The active layer 27 may be formed into a single or multiple quantum well structure. The semiconductor layers 25, 27, and 29 may be grown on the GaN substrate so as to have a dislocation density of about $5 \times 10^6 / cm^2$ or less.

The semiconductor stack 30 may be grown on the GaN substrate 21 by a process such as metal organic chemical vapor deposition (MOCVD) or molecular beam epitaxy (MBE).

Figure 2:
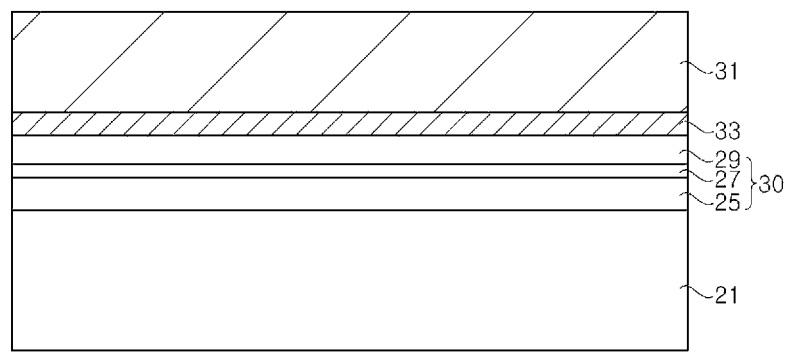

Referring to FIG. 2, a support substrate 31 is formed on the semiconductor stack 30. The support substrate 31 may be a conductive or an insulative substrate. After the support substrate 31 is fabricated separately from the semiconductor stack 30, it may be attached to the semiconductor stack 30 by a bonding metal 33. Alternatively, the support substrate 31 may be formed on the semiconductor stack 30 by using a plating technique.

Moreover, before the support substrate 31 is formed, a reflective metal layer (not shown) may be formed on the semiconductor stack 30, and an insulation layer and/or a barrier metal layer (not shown) for protecting the reflective metal layer may be formed.

Figure 3:
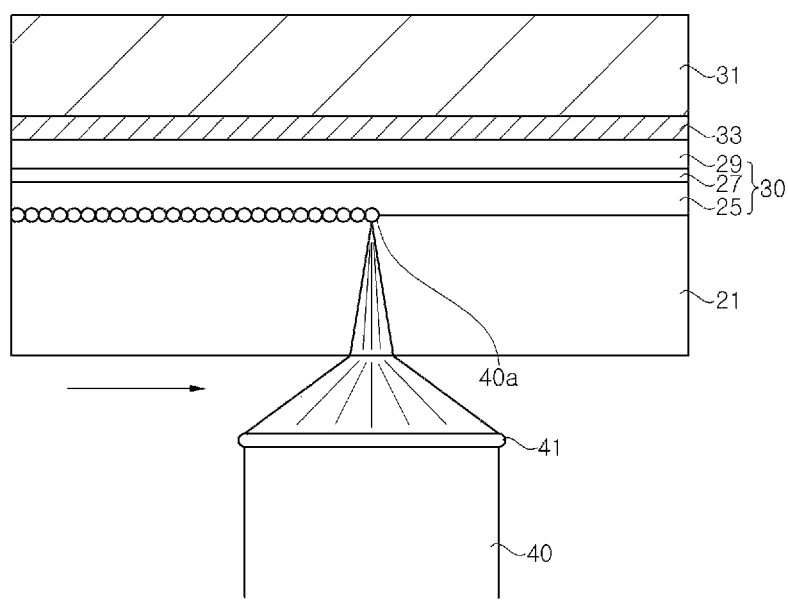

Referring to FIG. 3, a laser 40 is irradiated through the lower surface of the GaN substrate 21. The laser 40 may be an infrared laser, e.g., an Nd:YAG laser having a wavelength of 1064 nm. The laser 40 may be continuously irradiated through the lower surface of the GaN substrate 21, but the invention is not limited thereto. The laser 40 may be, for example, a pulse laser having a femtosecond or picosecond pulse width.

The laser 40 may be focused in the vicinity of an interface between the GaN substrate 21 and the semiconductor stack 30 by a light condensing device, such as a lens 41. The laser 40 is focused at focusing position 40s, which may be located at the interface between the GaN substrate 21 and the semiconductor stack 30, but the invention is not limited thereto. That is, the laser 40 may be focused inside the GaN substrate 21 or semiconductor stack 30.

Because the laser 40 has energy lower than the bandgap (Eg) of the GaN substrate 21, the laser 40 is transmitted through the lower surface of the GaN substrate 21 and travels into the GaN substrate 21. Meanwhile, the laser 40 is focused at the focusing position 40a to have an increased power density. Accordingly, the energy (nhv) obtained by focusing a plurality of photons is greater than the bandgap of a GaN-based compound semiconductor. Thus, the laser 40 is absorbed into the GaN-based compound semiconductor at the focusing position. The power density of the laser 40 may be controlled so that the laser 40 is absorbed at the focusing position while being transmitted through the GaN substrate 21.

The laser 40 is scanned such that the focusing positions 40a to be located at the same height from the lower surface of the GaN substrate 21, thereby forming a laser absorption region having a generally planar shape. The laser absorption region is formed by the focusing positions 40a, and the GaN-based compound semiconductor is decomposed or damaged at these positions.

Figure 4:
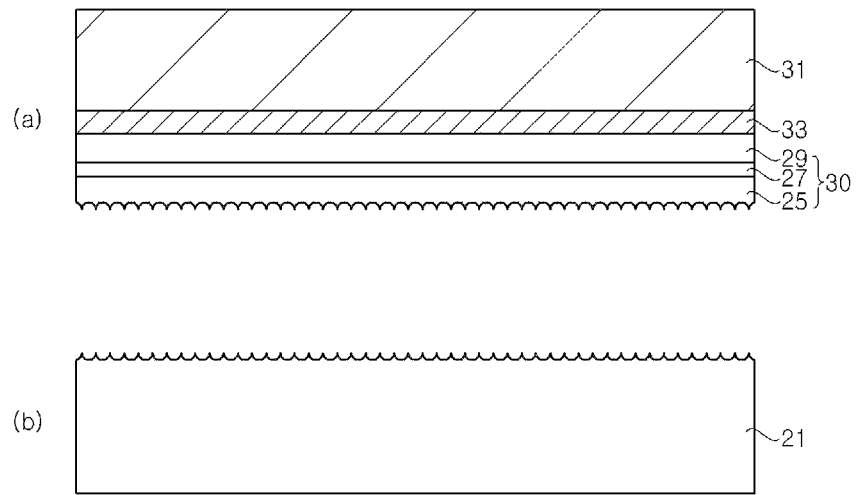

Referring to FIG. 4, the GaN substrate 21 is separated from the semiconductor stack 30 in the laser absorption region. The GaN substrate 21 may be separated without applying an external force because the GaN-based compound semiconductor is decomposed in the laser absorption region. In the alternative, the GaN substrate 21 may be separated using an external force. Because the binding force of the GaN-based compound semiconductor is weak in the laser absorption region, the GaN substrate 21 can be easily separated by application of an external force.

A surface exposed by the separation of the GaN substrate 21 may be relatively rough, as shown in FIG. 4.

Figure 5:
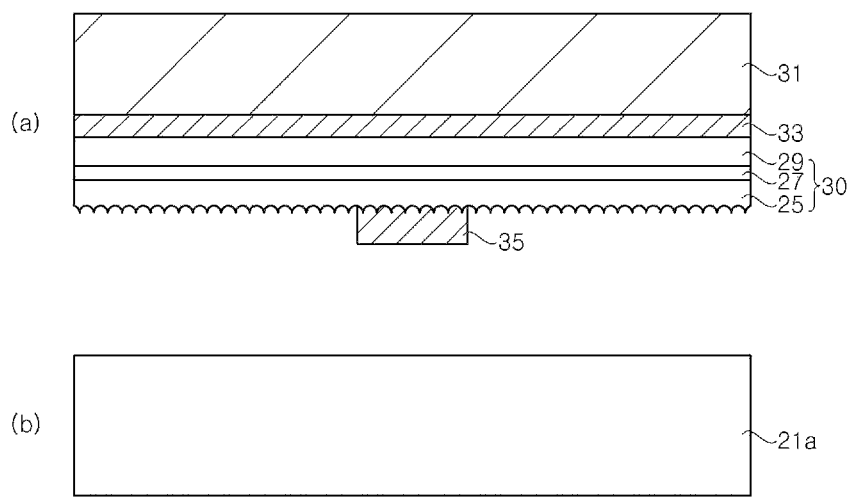

Referring to FIG. 5, an electrode 35 is formed on the first conductivity-type semiconductor layer 25 that has been exposed by the separation of the GaN substrate 21. The exposed surface of the first conductivity-type semiconductor layer 25 may be formed to be even rougher using a photo-electron-chemical etching technique before the formation of the electrode 35. In addition, the exposed surface of the first conductivity-type semiconductor layer 25 may be dry-etched or wet-etched to remove an impurity remaining on the surface or a damaged region.

Thereafter, separation into individual devices is performed to complete LEDs with a vertical structure.

Meanwhile, the substrate 21 that has been separated from the semiconductor stack 30 may be polished into a substrate 21a having a smooth upper surface, which in turn may be reused as a growth substrate for growing GaN-based semiconductor layers thereon.

According to this exemplary embodiment, the GaN substrate 21 can be separated from the semiconductor stack by using a laser with relatively low energy. Thus, the semiconductor stack 30 with satisfactory crystal quality is formed on the GaN substrate 21 and, in turn, is used to fabricate an LED with a vertical structure, thereby providing a high-efficiency LED.

Although the method of fabricating the LED has been described in this exemplary embodiment, the invention is not limited to the LED, and GaN-based semiconductor layers grown on a GaN substrate can be used to fabricate various GaN-based semiconductor devices, such as a high electron mobility transistor (HEMT).

FIGS. 6 to 10 are sectional views illustrating a method of fabricating a GaN-based semiconductor device according to another exemplary embodiment of the present invention.

Figure 6:
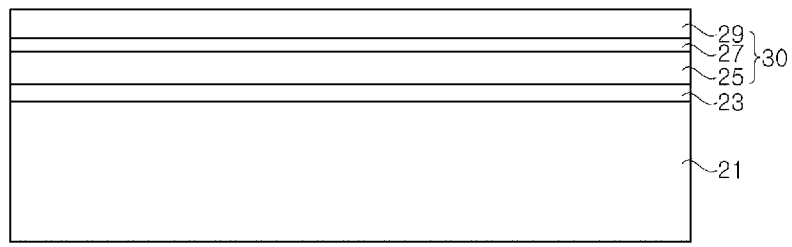
FIG. 6, FIG. 7, FIG. 8, FIG. 9, and FIG. 10 are sectional views illustrating a method of fabricating a GaN-based semiconductor device according to another exemplary embodiment of the present invention.

Referring to FIG. 6, as described with reference to FIG. 1, a GaN substrate 21 is prepared, and a semiconductor stack 30 is formed on the GaN substrate 21. However, in this exemplary embodiment, a sacrificial layer 23 is additionally formed on the GaN substrate 21. The sacrificial layer 23 is formed as a semiconductor layer having a bandgap smaller than that of the GaN substrate 21. For example, the sacrificial layer 23 may be formed of SiC, InN, InGaN, or the like.

As shown in FIG. 6, the sacrificial layer 23 may be directly formed on the GaN substrate 21, but the invention is not limited thereto. For example, the sacrificial layer 23 may be formed inside the semiconductor stack 30.

Figure 7:
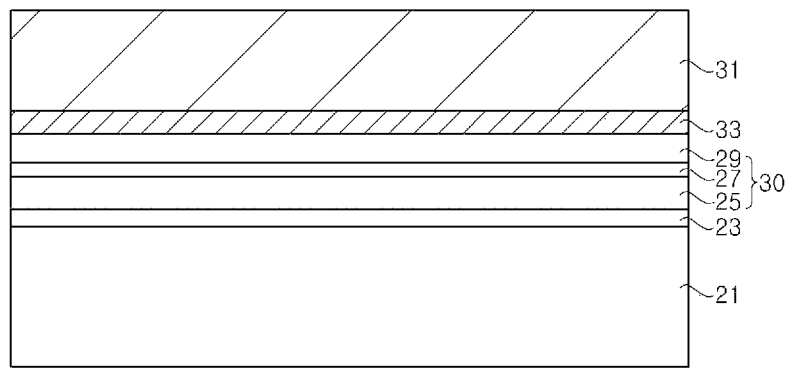

Referring to FIG. 7, a support substrate 31 is formed on the semiconductor stack 30. The process of forming the support substrate 31 is the same as described with reference to FIG. 2, and therefore, a detailed description thereof will be omitted.

Figure 8:
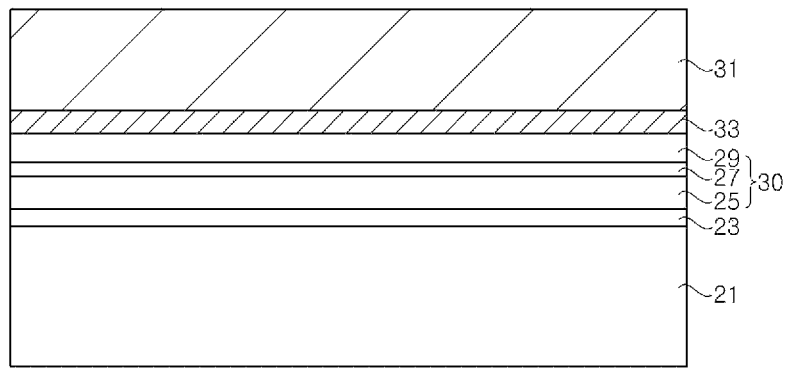

Referring to FIG. 8, a laser 50 is irradiated from a lower surface of the GaN substrate 21. The laser 50 is transmitted through the GaN substrate 21 and then absorbed by the sacrificial layer 23, so that a laser absorption region is formed in the sacrificial layer 23. Furthermore, the laser 50 is scanned to form a generally planar laser absorption region.

The laser 50 has an energy that is lower than the bandgap of the GaN substrate 21 and higher than the bandgap of the sacrificial layer 23. Thus, the laser 50 is transmitted through the GaN substrate 21 and then absorbed into the sacrificial layer 23. For example, the laser 50 may have a wavelength in a range of about 370 to 490 nm. The laser 50 may include, for example, an InGaN laser, a Ti:sapphire laser, an Alexandrite laser, and the like, but is not limited thereto.

In this exemplary embodiment, the laser 50 may be irradiated without being focused, but in other exemplary embodiments the laser 50 may be focused to increase power density thereof. Although it has been described that the laser 50 having energy higher than the bandgap of the sacrificial layer 23 is used, an infrared laser may be irradiated and focused on the sacrificial layer 23 as described with reference to FIG. 3.

Figure 9:
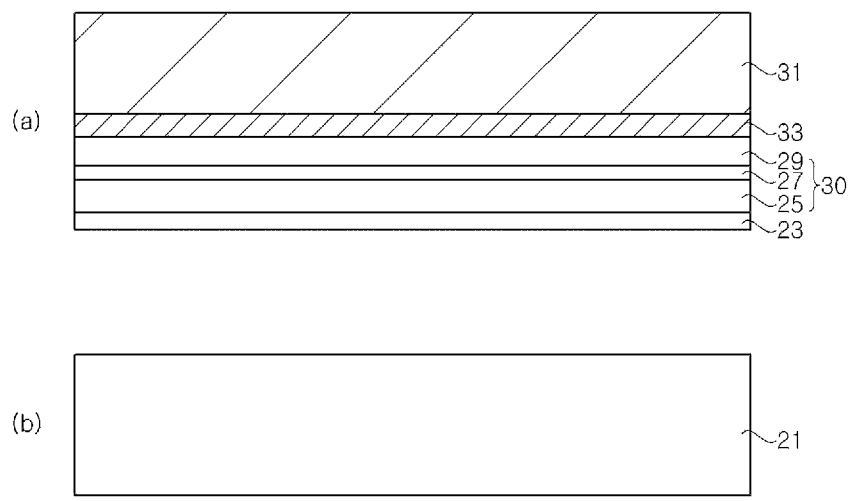

Referring to FIG. 9, as described with reference to FIG. 4, the GaN substrate 21 is separated from the semiconductor stack 30 in the laser absorption region. As the sacrificial layer 23 is decomposed by the laser 50, the GaN substrate 21 may be separated from the semiconductor stack 30. Alternatively, the GaN substrate 21 may be separated from the semiconductor stack 30 by applying an external force to the laser absorption region, which has a low binding capacity.

A portion of the sacrificial layer 23 may remain on the semiconductor stack 30 and the GaN substrate 21. The remaining portions of the sacrificial layer 23 may be removed by means of dry etching, wet etching, polishing, or the like.

Figure 10:
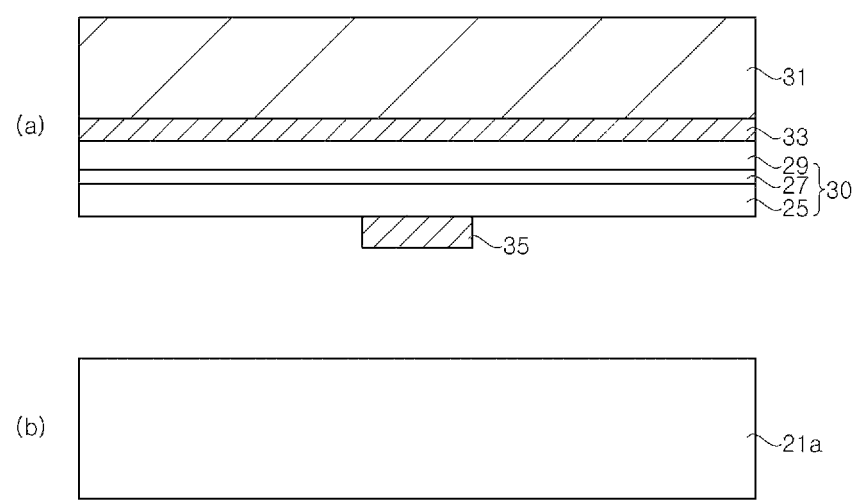

Referring to FIG. 10, an electrode 35 is formed on the exposed first conductivity-type semiconductor layer 25. Then, separation into individual devices is performed to complete LEDs with a vertical structure.

The substrate 21 that has been separated from the semiconductor stack 30 may then be prepared as a reusable GaN substrate 21a by undergoing surface treatment such as surface polishing.

According to the exemplary embodiments of the present invention, it is possible to provide a method of fabricating a GaN-based semiconductor device, in which a GaN substrate can be separated from a semiconductor stack by using a laser. Accordingly, the separated GaN substrate can be reused. Further, semiconductor layers are grown using the GaN substrate as a growth substrate, thereby enabling formation of a semiconductor stack with a low dislocation density. Accordingly, it is possible to fabricate a high-efficiency LED with a vertical structure.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a gallium nitride (GaN)-based semiconductor device, the method comprising:
    growing GaN-based semiconductor layers on an upper surface of a GaN substrate to form a semiconductor stack;
    forming a support substrate on the semiconductor stack;
    scanning a laser across a lower surface of the GaN substrate, the laser emitting a laser beam that is focused at focusing positions, such that the focusing positions form a laser absorption region inside a structure comprising the GaN substrate and the semiconductor stack; and
    separating the GaN substrate from the semiconductor stack to form the GaN semiconductor device.

2. The method of claim 1, wherein the laser absorption region is formed inside the GaN substrate, at an interface between the GaN substrate and the semiconductor stack, or inside the semiconductor stack.

3. The method of claim 1, wherein the laser absorption region has a generally planar shape.

4. The method of claim 2, wherein the GaN substrate is separated from the semiconductor stack in the laser absorption region.

5. The method of claim 1, wherein:
the laser has an infrared wavelength; and
the laser beam comprises a pulsed laser beam, each of the beam pulses being focused at one of the focusing positions.

6. The method of claim 1, wherein the laser comprises a femtosecond or picosecond pulse laser.

7. The method of claim 1, wherein the semiconductor stack comprises a GaN layer that contacts the GaN substrate.

8. The method of claim 1, further comprising:
forming a sacrificial layer between the GaN substrate and the semiconductor stack,
wherein the sacrificial layer has a bandgap narrower than a bandgap of the GaN substrate.

9. The method of claim 8, wherein the energy of the laser is lower than the bandgap of the GaN substrate and higher than the bandgap of the sacrificial layer.

10. The method of claim 8, wherein the sacrificial layer comprises silicon carbide, indium nitride, or indium gallium nitride.

11. The method of claim 1, further comprising polishing a surface of the GaN substrate separated from the semiconductor stack.

12. The method of claim 1, further comprising reusing the polished GaN substrate as a growth substrate.

13. The method of claim 1, wherein the semiconductor stack comprises:
a first conductivity-type semiconductor layer;
a second conductivity-type semiconductor layer; and
an active layer disposed between the first and second conductivity-type semiconductor layers,
wherein the GaN-based semiconductor device comprises a light emitting diode.

14. The method of claim 1, wherein the semiconductor stack has a dislocation density of about $5 \times 10^6/cm^2$ or less.

15. The method of claim 1, wherein the growing of the GaN-based semiconductor layers comprises using metal organic chemical vapor deposition (MOCVD) or molecular beam epitaxy (MBE).

16. A method of fabricating a gallium nitride (GaN)-based semiconductor device, the method comprising:
growing GaN-based semiconductor layers on an upper surface of a GaN substrate to form a semiconductor stack;
forming a sacrificial layer between the GaN substrate and the semiconductor stack;
forming a support substrate on the semiconductor stack;
scanning a laser across a lower surface of the GaN substrate, the laser emitting a laser beam that is focused a focusing positions, such that the focusing positions form a laser absorption region inside the sacrificial layer; and
separating the GaN substrate from the semiconductor stack to form the GaN semiconductor device,
wherein the sacrificial layer has a bandgap narrower than a bandgap of the GaN substrate.

17. The method of claim 16, wherein the energy of the laser is lower than the bandgap of the GaN substrate and higher than the bandgap of the sacrificial layer.

18. The method of claim 17, wherein the sacrificial layer comprises silicon carbide, indium nitride, or indium gallium nitride.

19. The method of claim 1, wherein the laser absorption region is formed at an interface between the substrate and the semiconductor stack.

20. The method of claim 16, wherein the laser absorption region is formed at an interface between the substrate and the semiconductor stack.

* * * * *